United States Patent
Yamatoya (10) Patent No.: US 11,385,403 B2
(45) Date of Patent: Jul. 12, 2022

(54) OPTICAL TRANSMISSION DEVICE

(71) Applicant: Mitsubishi Electric Corporation, Tokyo (JP)

(72) Inventor: Takeshi Yamatoya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/982,011

(22) PCT Filed: Jul. 12, 2018

(86) PCT No.: PCT/JP2018/026275
§ 371 (c)(1),
(2) Date: Sep. 17, 2020

(87) PCT Pub. No.: WO2020/012590
PCT Pub. Date: Jan. 16, 2020

(65) Prior Publication Data
US 2021/0103093 A1    Apr. 8, 2021

(51) Int. Cl.
*G02B 6/12* (2006.01)
*G02B 6/42* (2006.01)
(Continued)

(52) U.S. Cl.
CPC ..... *G02B 6/12004* (2013.01); *G02B 6/12019* (2013.01); *G02B 6/42* (2013.01);
(Continued)

(58) Field of Classification Search
CPC ............ G02B 6/12004; G02B 6/12019; H01S 5/02325
See application file for complete search history.

(56) References Cited

U.S. PATENT DOCUMENTS 5,883,988 A * 3/1999 Yamamoto ........... G02B 6/4214
                                                        385/14
5,909,524 A * 6/1999 Tabuchi ................. G02B 6/423
                                                        385/49
(Continued)

FOREIGN PATENT DOCUMENTS

CN    107078462 A    8/2017
JP    2009-537871 A    10/2009
(Continued)

OTHER PUBLICATIONS

Thacker et al., Flip-Chip Integrated Silicon Photonic Bridge Chips for Sub-Picojoule Per Bit Optical Links, 2010 Electronic Components and Technology Conference (Year: 2010).*
(Continued)

*Primary Examiner* — Peter Radkowski
(74) *Attorney, Agent, or Firm* — Studebaker & Brackett PC (57) ABSTRACT

An optical transmission device includes a semiconductor laser chip in which a semiconductor laser array having a plurality of distributed feedback semiconductor lasers formed on a first semiconductor substrate is formed, a semiconductor waveguide chip in which a semiconductor modulator array formed on a second semiconductor substrate and having the same number of semiconductor modulators as the semiconductor lasers is formed. In the optical transmission device, a waveguide and a waveguide are butt-joined such that a distance between an end face of the waveguide on a side to the semiconductor modulator array in each of the semiconductor lasers of the semiconductor laser array and an end face of the waveguide on a side to the semiconductor laser array in each of the semiconductor modulators of the semiconductor modulator array is 10 μm or less.

22 Claims, 5 Drawing Sheets

(51) Int. Cl.
*H01S 5/02* (2006.01)
*H01S 5/14* (2006.01)
*H01S 5/40* (2006.01)

(52) U.S. Cl.
CPC .............. *H01S 5/021* (2013.01); *H01S 5/141* (2013.01); *H01S 5/4025* (2013.01); *G02B 2006/12142* (2013.01)

(56) References Cited

U.S. PATENT DOCUMENTS

| | | | |
|---|---|---|---|
| 6,391,214 B1* | 5/2002 | Kovacic | G02B 6/42 216/24 |
| 6,693,936 B2* | 2/2004 | Kitaoka | G02B 6/4249 372/50.11 |
| 7,257,283 B1 | 8/2007 | Liu et al. | |
| 9,316,788 B2* | 4/2016 | Witzens | G02B 6/423 |
| 9,372,306 B1 | 6/2016 | Nagarajan et al. | |
| 10,468,851 B1 | 11/2019 | Doerr | |
| 2001/0053167 A1* | 12/2001 | Kitaoka | G02B 6/423 372/50.11 |
| 2003/0058907 A1* | 3/2003 | Nasu | H01S 5/024 372/34 |
| 2008/0044128 A1* | 2/2008 | Kish | G02B 6/12004 385/14 |
| 2012/0087004 A1* | 4/2012 | Kwon | G02F 1/2257 359/326 |
| 2013/0209112 A1* | 8/2013 | Witzens | G02B 6/13 398/214 |
| 2015/0323738 A1 | 11/2015 | Sekiguchi et al. | |
| 2015/0372453 A1 | 12/2015 | Yamazaki | |
| 2016/0013609 A1 | 1/2016 | Doerr | |
| 2017/0098920 A1 | 4/2017 | Doerr | |
| 2018/0024303 A1* | 1/2018 | Nakanishi | G02B 6/4215 385/33 |

FOREIGN PATENT DOCUMENTS

| | | |
|---|---|---|
| JP | 2014-239222 A | 12/2014 |
| JP | 2015-216169 A | 12/2015 |
| JP | 2015-232621 A | 12/2015 |
| JP | 2017-142464 A | 8/2017 |
| WO | 2014/118836 A1 | 8/2014 |

OTHER PUBLICATIONS

Ueno et al., Distributed feedback laser diode with fast wavelength switching and wide tuning range, 2017 Conference on Lasers and Electro-Optics Pacific Rim (Year: 2017).*

Cunningham et al., Aligning Chips Face-to-Face for Dense Capacitive and Optical Communication, IEEE Transactions on Advanced Packaging, vol. 33, No. 2, May 2010 (Year: 2010).*

International Search Report issued in PCT/JP2018/026275; dated Sep. 18, 2018.

An Office Action mailed by China National Intellectual Property Administration dated Nov. 19, 2021, which corresponds to Chinese Patent Application 201880094936.1 and is related to U.S. Appl. No. 16/982,011; with English language translation.

* cited by examiner

OPTICAL TRANSMISSION DEVICE

TECHNICAL FIELD

The present application relates to an optical transmission device.

BACKGROUND ART

A transmission device for optical communication (optical transmission device) configured with a semiconductor laser array with a plurality of lasers and a semiconductor modulator array with a plurality of modulators can increase the transmission capacity compared to an optical transmission device configured with a single laser and a single modulator. As a method of integrating a semiconductor laser array and a semiconductor modulator array in a small size, there are a method for a monolithic integration on a semiconductor substrate such as an InP substrate and a method for a hybrid integration of a semiconductor laser array and a semiconductor modulator array formed on different semiconductor substrates by mounting them integrally. When a semiconductor laser array on an InP substrate and a semiconductor modulator array on a silicon substrate are integrated, the method of the hybrid integration is mainly used.

In Patent Document 1, an optical transmission device in which a semiconductor laser array and a semiconductor modulator array are hybrid integrated is disclosed. The optical transmission device of Patent Document 1 has a laser structure in which a III-V semiconductor (III-V gain medium material) as a gain medium material is bonded to a waveguide (silicon waveguide) made of a silicon-based material and a reflector structure (optical resonator with reflector pair) is formed in the waveguide made of the silicon-based material.

CITATION LIST

Patent Document

Patent Document 1: Japanese National Publication of International Patent Application No. 2009-537871 (FIG. 1, FIG. 2, paragraphs: 0015 to 0024)

SUMMARY OF INVENTION

Problems to be Solved by Invention

The optical transmission device disclosed in Patent Document 1 requires a high level of technology for bonding a silicon waveguide and a III-V gain medium material, and has a complicated laser structure in which no resonator structure is provided in the III-V gain medium material and a resonator structure is provided in the silicon waveguide. Further, the optical transmission device of Patent Document 1 has a problem in that an optical coupling loss occurs between the III-V gain medium material and the silicon waveguide, and the ratio of laser output light (laser emitted light) to injection current (refer to as laser efficiency) is worse than that of a semiconductor laser having a resonator structure formed of only the III-V material.

The technology disclosed in the specification of the present application has been made in order to solve the above problems, and an object is to achieve an optical transmission device that has a simple structure and high laser efficiency, and in which a semiconductor laser array and a semiconductor modulator array are hybrid integrated.

Means for Solving Problems

An example of an optical transmission device disclosed in the specification of the present application is an optical transmission device that includes a semiconductor laser array having a plurality of distributed feedback semiconductor lasers formed on a first semiconductor substrate, and a semiconductor modulator array formed on a second semiconductor substrate and having the same number of semiconductor modulators as the semiconductor lasers. The example of the optical transmission device includes a semiconductor laser chip in which the semiconductor laser array is formed, and a semiconductor waveguide chip in which the semiconductor modulator array is formed. In the optical transmission device, a laser waveguide and a modulator waveguide are butt-joined such that a distance between an end face of the laser waveguide being a waveguide on a side to the semiconductor modulator array in each of the semiconductor lasers of the semiconductor laser array and an end face of the modulator waveguide being a waveguide on a side to the semiconductor laser array in each of the semiconductor modulators of the semiconductor modulator array is 10 μm or less.

Effect of Invention

In an example of an optical transmission device disclosed in the specification of the present application, the laser waveguide and the modulator waveguide are butt-joined such that the distance between an end face of the laser waveguide of the semiconductor laser array and an end face of the modulator waveguide of the semiconductor modulator array facing each other is 10 μm or less, and thus the structure is simple and high laser efficiency can be obtained.

MODES FOR CARRYING OUT INVENTION

Embodiment 1

Figure 1:
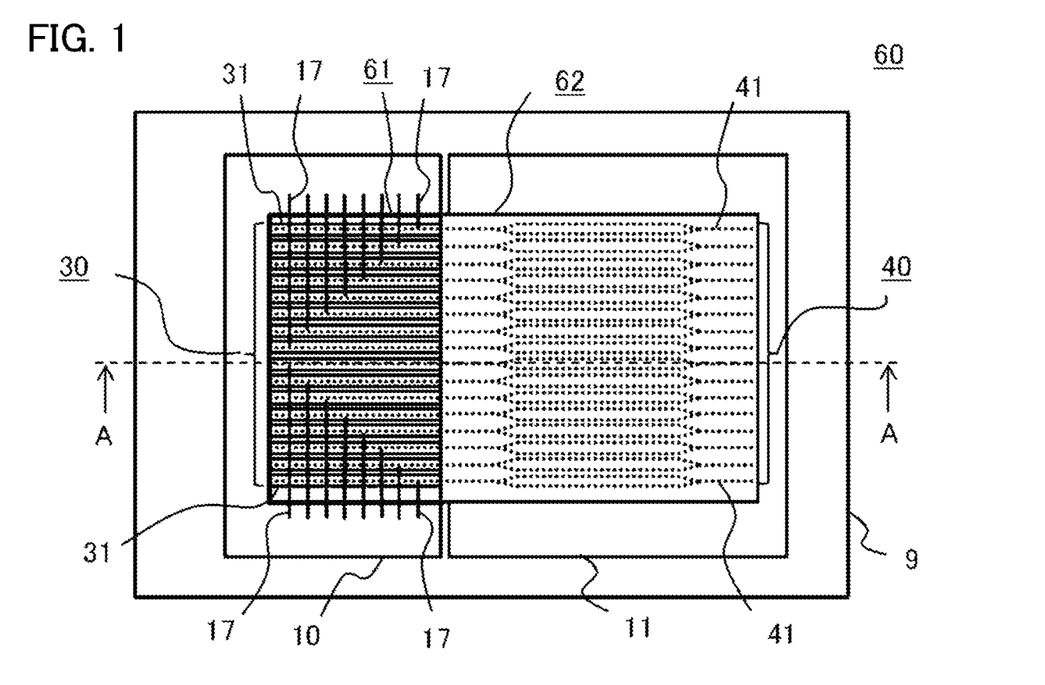
FIG. 1 is a plan view showing an optical transmission device according to Embodiment 1.
Figure 2:
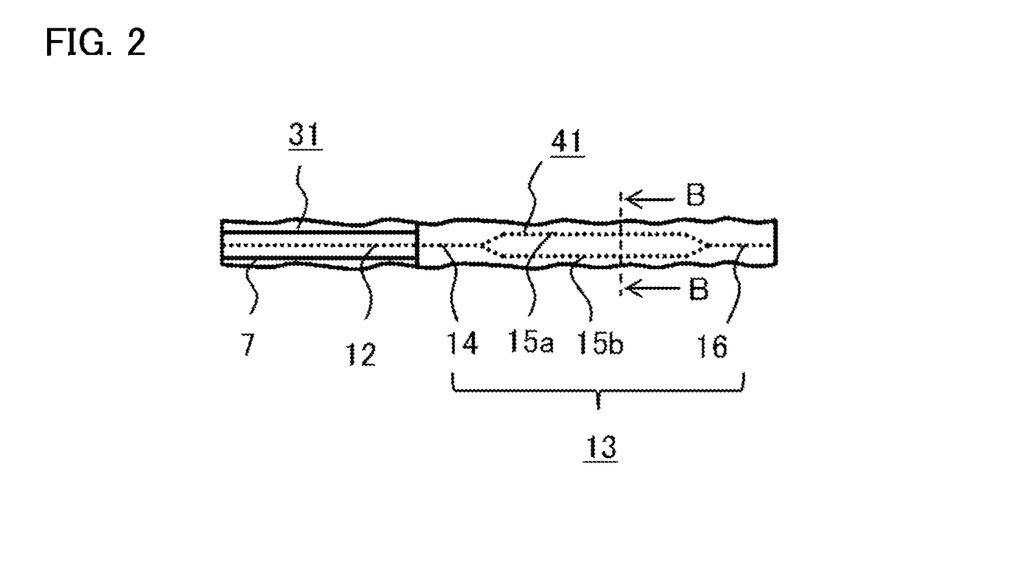
FIG. 2 shows a schematic configuration of a semiconductor laser and a semiconductor modulator of FIG. 1.
Figure 3:
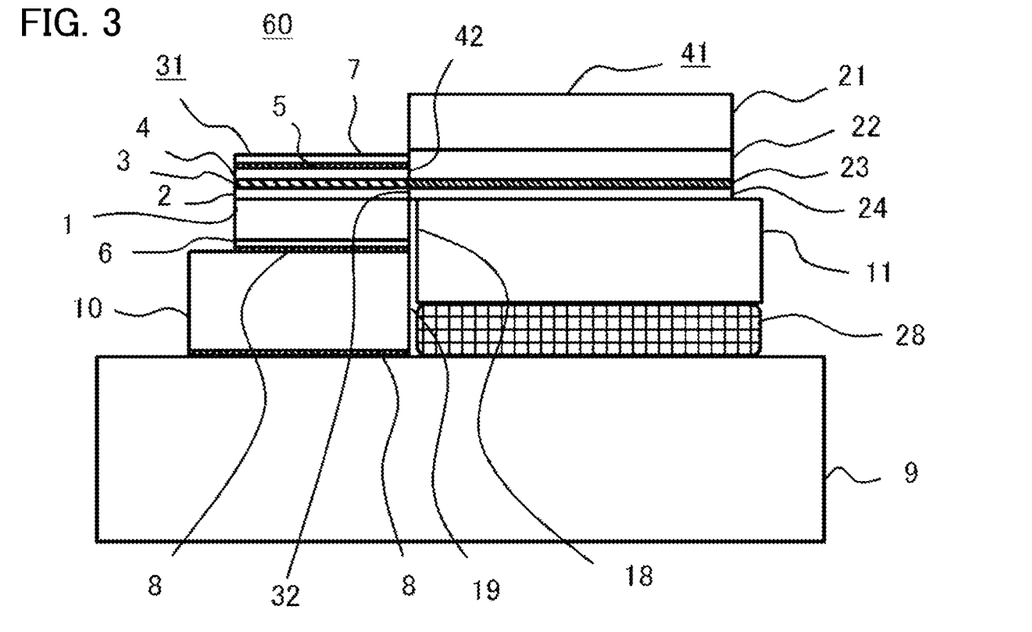
FIG. 3 is a cross-sectional view of the optical transmission device of FIG. 1.
Figure 4:
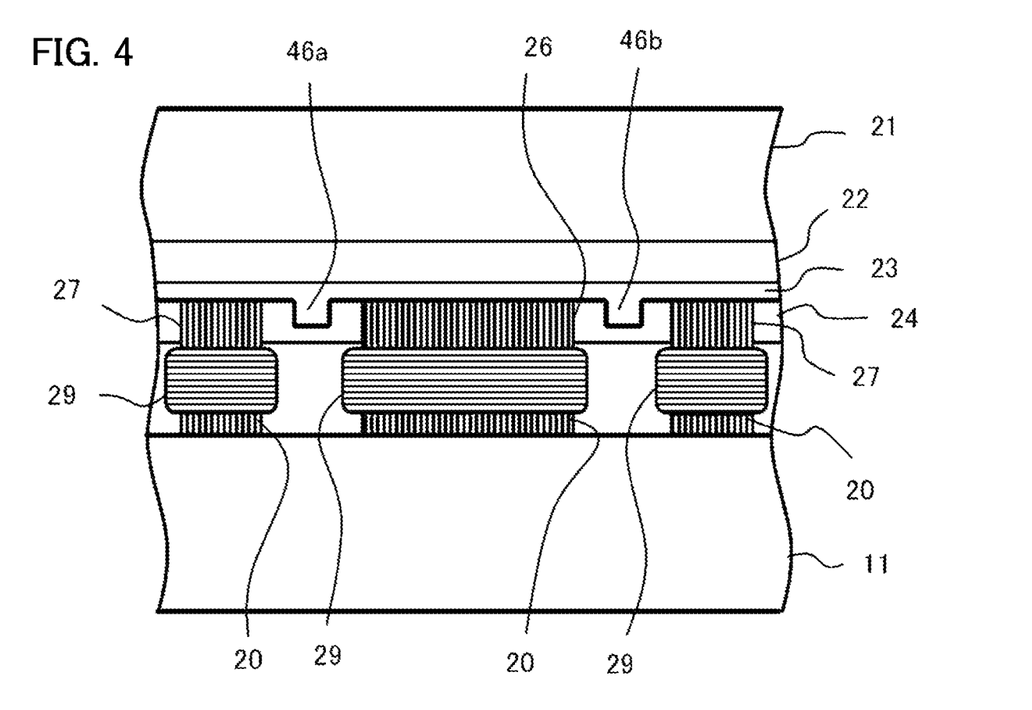
FIG. 4 is a cross-sectional view of the semiconductor modulator of FIG. 2.
Figure 5:
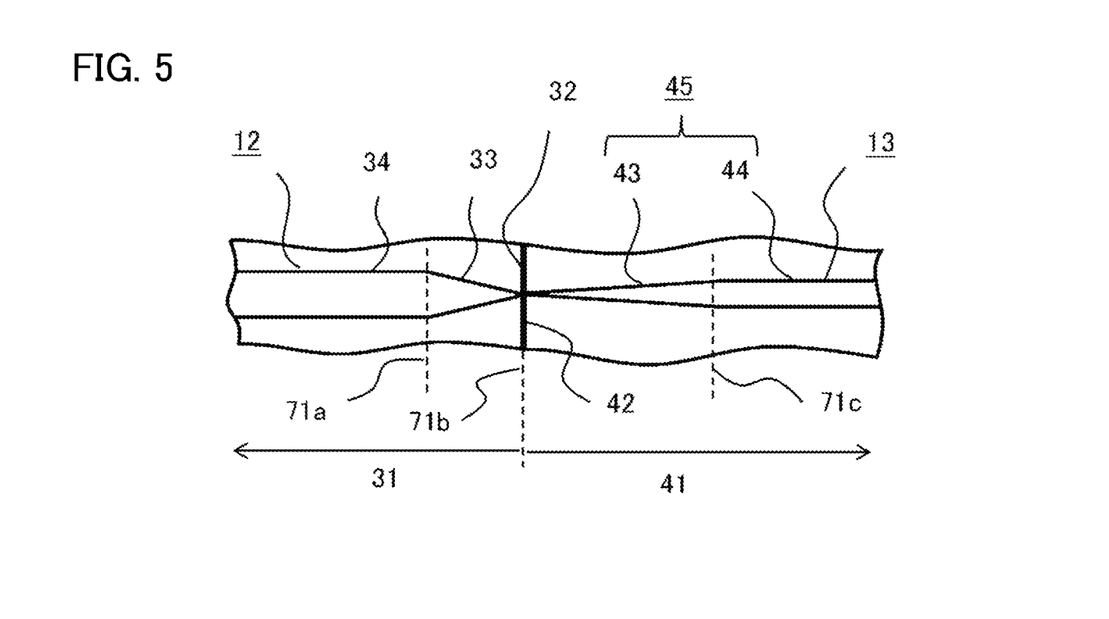
FIG. 5 is a plan view showing waveguide shapes of the semiconductor laser and semiconductor modulator of FIG. 1.

FIG. 1 is a plan view showing an optical transmission device according to Embodiment 1. FIG. 2 shows a schematic configuration of a semiconductor laser and a semiconductor modulator of FIG. 1, and FIG. 3 is a cross-sectional view of the optical transmission device of FIG. 1. FIG. 4 is a cross-sectional view of the semiconductor modulator of FIG. 2, and FIG. 5 is a plan view showing waveguide shapes of the semiconductor laser and semiconductor modulator of FIG. 1. FIG. 3 shows a cross section taken along the line A-A in FIG. 1, and FIG. 4 shows a cross section taken along the line B-B in FIG. 2. The optical transmission device 60 of Embodiment 1 is an optical transmission device in which a semiconductor laser chip 61 having a semiconductor laser array 30 formed therein and a semiconductor waveguide chip 62 having a semiconductor modulator array 40 formed therein are hybrid integrated, that is, a hybrid integrated transmission device. The optical transmission device 60 includes the semiconductor laser chip 61 in which the semiconductor laser array 30 is formed, the semiconductor waveguide chip 62 in which the semiconductor modulator array 40 is formed, a submount substrate 10 on which the semiconductor laser chip 61 is mounted, a submount substrate 11 on which the semiconductor waveguide chip 62 is mounted, and a base 9 on which the submount substrates 10 and 11 are mounted. The semiconductor laser array 30 has a plurality of semiconductor lasers 31, and the semiconductor modulator array 40 has the same number of semiconductor modulators 41 as the semiconductor lasers 31. On the base 9, the semiconductor laser chip 61 is mounted via the submount substrate 10, and the semiconductor waveguide chip 62 is mounted via the submount substrate 11. The semiconductor laser chip 61 is mounted on the submount substrate 10, and the semiconductor waveguide chip 62 is mounted on the submount substrate 11.

The semiconductor laser array 30 includes sixteen distributed feedback semiconductor lasers 31 formed on an n-InP substrate 1. In each of the semiconductor lasers 31, an n-InP cladding layer 2, an InGaAsP active layer 3, a p-InP cladding layer 4, and a p-InGaAs contact layer 5 are sequentially formed on the n-InP substrate 1. On the top (on the front surface) of the InGaAsP active layer 3, a diffraction grating structure (not shown) constituted by a p-InGaAsP layer and the p-InP cladding layer 4 is formed. Each of the semiconductor lasers 31 has a so-called embedded waveguide structure in which an InP embedded layer (not shown) is embedded in both sides of the InGaAsP active layer 3. A cathode electrode 6 common to all the semiconductor lasers 31 is formed on the rear surface (the surface facing the submount substrate 10) of the n-InP substrate 1, and an anode electrode 7 is formed above a waveguide 12 (laser waveguide) of each of the semiconductor lasers 31. The waveguide 12 (laser waveguide) includes the InGaAsP active layer 3. The period of the diffraction grating of each of the semiconductor lasers 31 is different, and each of the semiconductor lasers 31 emits light of a different wavelength. Being provided with a plurality of semiconductor lasers 31 emitting light of different wavelengths, the semiconductor laser array 30 is a multi-wavelength light source. The wavelength of the emitted light output by the semiconductor laser array 30 is in the 1.3 μm band. The back side of the n-InP substrate 1 of the semiconductor laser array 30, namely, the back side of the n-InP substrate 1 of the semiconductor laser chip 61, is mounted on the submount substrate 10 (on the front surface) with solder 8. Further, the submount substrate 10 on which the semiconductor laser chip 61 is mounted is mounted on the base 9 (on the front surface) made of metal with the solder 8. The anode electrode 7 of each of the semiconductor lasers 31 is connected to a metal wiring (not shown) formed on the submount substrate 10 by a metal wire 17 such as a gold wire.

The semiconductor modulator array 40 includes the semiconductor modulators 41 that are sixteen Mach-Zehnder modulators formed on a silicon substrate 21. Each of the semiconductor modulators 41 has a waveguide 13 (modulator waveguide), and the waveguide 13 is constituted by an incident side waveguide 14, two arm waveguides 15a and 15b, and an emission side waveguide 16. In each of the semiconductor modulator 41, a first insulating layer 22 of $SiO_2$, a silicon layer 23, and a second insulating layer 24 of $SiO_2$ are sequentially formed on the surface of a silicon substrate 21 (surface on the side facing the submount substrate 11). Each of the semiconductor modulator 41 has a rib waveguide structure in which a mesa stripe is formed in the silicon layer 23. That is, the incident side waveguide 14, the two arm waveguides 15a and 15b, and the emission side waveguide 16 each has a rib waveguide structure in which a mesa stripe is formed. In FIG. 4, mesa stripes 46a and 46b in the two arm waveguides 15a and 15b are shown. As shown in FIG. 4, each of the semiconductor modulators 41 has a cathode electrode 26 and an anode electrode 27 on both sides of each of the arm waveguides 15a, 15b, that is, on both sides of each of the mesa stripes 46a, 46b, and the cathode electrode 26 and the anode electrode 27 are both formed on the surface of the silicon layer 23 on the waveguide side (opposite side to the silicon substrate 21, namely, on the side to the submount substrate 11). That is, the cathode electrode 26 and the anode electrode 27 are formed on the modulator waveguide (waveguide 13) side, which is the opposite side to the silicon substrate 21.

The semiconductor waveguide chip 62 in which the semiconductor modulator array 40 is formed is mounted from its waveguide side on the submount substrate 11 (on the front surface) with a solder bump 29. The cathode electrode 26 and the anode electrode 27 of each of the semiconductor modulators 41 are connected to metal wiring 20 formed on the submount substrate 11 with the solder bump 29. In other words, the semiconductor waveguide chip 62 in which the semiconductor modulator array 40 is formed differs from the semiconductor laser chip 61 in which the semiconductor laser array 30 is formed in that it does not use the metal wire 17 for the electrical connection, but uses flip-chip mounting. The solder bump 29 is a connecting material different from the metal wire 17. FIG. 4 shows an example in which one cathode electrode 26 is disposed between the arm waveguides 15a and 15b, and two anode electrodes 27 are disposed such that the one is on the outside to the arm waveguide 15a and the other is on the outside to the arm waveguide 15b. When the semiconductor modulator array 40 is mounted on the submount substrate 11, it is mounted in such a way that a modulator end face 42 being an end face of the semiconductor modulator array 40 on the side to the semiconductor laser array 30 protrudes toward the semiconductor laser array 30 (protruding toward the optical axis direction) from a substrate end face 18 being an end face of the submount substrate 11 on the side to the semiconductor laser array 30. That is, the semiconductor waveguide chip 62 is disposed in such a manner that the modulator end face 42 including an end face of the modulator waveguide (waveguide 13) is disposed closer to a laser end face 32 including an end face of the laser waveguide (waveguide 12) than the substrate end face 18 being the end face of the submount substrate 11 on the side to the semiconductor laser array 30. The submount substrate 11 of the semiconductor modulator array 40 is mounted on the base 9 (on the front surface) using a resin 28.

The optical transmission device 60 of Embodiment 1 is characterized in that each waveguide 12 of the semiconductor laser array 30 and each waveguide 13 of the semiconductor modulator array 40 are mounted so as to be butt-joined. Further, in the optical transmission device 60 of Embodiment 1, as described above, the semiconductor laser array 30 is mounted on the submount substrate 10 in the junction-up configuration with respect to the base 9 (configuration in which the InGaAsP active layer 3 is in the opposite side to the base 9), and the semiconductor modulator array 40 is mounted on the submount substrate 11 with the waveguide 13 facing the base 9. In other words, in the optical transmission device 60 of Embodiment 1, the semiconductor laser array 30 is disposed such that the position of the InGaAsP active layer 3 with respect to the base 9 is farther than the position of the n-InP substrate 1, and the semiconductor modulator array 40 is disposed such that the position of the waveguide 13 with respect to the base 9 is closer than the position of the silicon substrate 21. Further, it can also be stated that the semiconductor laser array 30 is disposed such that the laser waveguide (waveguide 12) including the active layer (InGaAsP active layer 3) of the semiconductor laser 31 is farther from the base 9 than the first semiconductor substrate (n-InP substrate 1), and the semiconductor modulator array 40 is disposed such that the modulator waveguide (waveguide 13) of the semiconductor modulator 41 is closer to the base 9 than the second semiconductor substrate (silicon substrate 21).

Next, referring to FIG. 5, a butt-joined portion where the waveguide 12 of the semiconductor laser array 30 and the waveguide 13 of the semiconductor modulator array 40 are butt-joined will be described. FIG. 5 shows the butt-joined portion between one semiconductor laser 31 of the semiconductor laser array 30 and one semiconductor modulator 41 of the semiconductor modulator array 40. In the semiconductor laser array 30, the laser end face 32 being an end face facing the semiconductor modulator array 40 is butt-joined to the modulator end face 42 being an end face facing the semiconductor laser array 30 in the semiconductor modulator array 40 within a predetermined distance. That is, they are disposed such that the gap is narrowed as much as possible to be optically coupled. Here, the predetermined distance is 10 μm or less.

The core layer of the waveguide 12 of the semiconductor laser array 30 is the InGaAsP active layer 3. The waveguide 13 of the semiconductor modulator array 40 is a rib waveguide, that is, the mesa stripes of the silicon layer. In FIG. 5, the planar shape of the InGaAsP active layer 3 is shown as the planar shape of the waveguide 12, and the planar shape of the mesa stripe 45 is shown as the planar shape of the waveguide 13. Since the waveguide 13 shown in FIG. 5 is on the side of the modulator end face 42 of the semiconductor modulator array 40 facing the semiconductor laser array 30, the incident side waveguide 14 shown in FIG. 2 is shown. The waveguide 12 includes a transmission part 34 in a region away from the laser end face 32, and a spot size conversion part 33 on the side of the laser end face 32. In FIG. 5, the waveguide width of the transmission part 34 on the left side from the broken line 71a is 1.3 μm. In the spot size conversion part 33 from the broken line 71a to the broken line 71b (position of the laser end face 32) in FIG. 5, the waveguide width tapers from a position (position of broken line 71a) 100 μm away from the laser end face 32 toward the laser end face 32. That is, the waveguide from the broken line 71a to the broken line 71b is a spot size converter for changing the spot size of the laser output light (laser emitted light).

The incident side waveguide 14 on the side of the modulator end face 42 of the waveguide 13 of the semiconductor modulator array 40 is provided with a transmission part 44 in a region apart from the modulator end face 42 and a spot size conversion part 43 on the side of the modulator end face 42. In FIG. 5, the waveguide width of the transmission part 44 on the right side from the broken line 71c, that is, the mesa stripe width, is 500 nm. In FIG. 5, in the spot size conversion part 43 from the broken line 71c to the broken line 71b (position of modulator end face 42), the waveguide width, that is, the mesa stripe width, tapers toward the end face from a position (position of dashed line 71c) 200 μm away from the modulator end face 42. That is, the waveguide (mesa stripe 45) from the broken line 71c to the broken line 71b is a spot size converter for changing the spot size of the laser output light (laser emitted light).

The optical transmission device 60 of Embodiment 1 is provided with the semiconductor laser array 30 for generating multi-wavelength light and the semiconductor modulator array 40, and thus a communication capacity (transmission capacity) can be expanded by wavelength multiplex communication as compared with a device provided with a single semiconductor laser 31 and a single semiconductor modulator 41. Further, the optical transmission device 60 of Embodiment 1 has a structure in which the semiconductor laser array 30 and the semiconductor modulator array 40, that is, the semiconductor laser chip 61 and the semiconductor waveguide chip 62, which are independent with each other, are hybrid integrated by mounting. Therefore, the optical transmission device 60 of Embodiment 1 has a simpler structure than the optical transmission device such as the one disclosed in Patent Document 1 in which a III-V semiconductor is bonded to a silicon semiconductor and a resonator structure is provided on the silicon semiconductor. Therefore, the optical transmission device 60 of Embodiment 1 is excellent in mass productivity and can be manufactured at a low cost. Further, the optical transmission device 60 of Embodiment 1 has a laser structure that is different from that of the optical transmission device of Patent Document 1 and in which the distributed feedback semiconductor lasers are formed independently on the n-InP substrate 1, and thus high laser efficiency can be obtained.

The optical transmission device 60 of Embodiment 1 has a structure in which a lens is not used for optical coupling between the semiconductor laser array 30 and the semiconductor modulator array 40. In a method using lenses for the optical coupling between semiconductor lasers and modulators, there are the following three problems. The first problem is that high precision alignment of each of the lenses is required and it takes a long time to mount all the lenses. The second problem is that the size of the optical transmission device is increased by a plurality of the lenses. A third problem is that the optical transmission device is expensive because a plurality of the lenses are used. In a method using lenses for the optical coupling between the lasers and the modulators, these three problems become more prominent when the number of semiconductor lasers and modulators increases.

In contrast, since the optical transmission device 60 of Embodiment 1 does not use a lens, the second and third problems do not occur. Also on the first problem, in the optical transmission device 60 of Embodiment 1, the waveguide pitches between the waveguides both in the semiconductor laser array 30 and the semiconductor modulator array 40 are made the same. That is, by aligning a pair of the waveguides of the two being the outermost semiconductor laser 31 and the outermost semiconductor modulator 41, the waveguides (waveguides 12, 13) in all the semiconductor lasers 31 and the semiconductor modulators 41 can be aligned.

As shown in FIG. 1, in the optical transmission device 60 of Embodiment 1, in the semiconductor laser array 30, the exposed surface of the n-InP substrate 1 (semiconductor substrate) is on the side to the base 9 (exposed surface of the semiconductor substrate is vertically directing downward), and in the semiconductor modulator array 40, the silicon substrate 21 (exposed surface of the semiconductor substrate) is on the opposite side to the base 9 (surface of the semiconductor substrate is vertically directing upward). In the semiconductor laser array 30 and the semiconductor modulator array 40 of the optical transmission device 60 of Embodiment 1, thicknesses of layers (structural layers) formed on the semiconductor substrate (on the surface of the semiconductor substrate) are thinner than a layer thickness of the semiconductor substrate. Therefore, in the optical transmission device 60 of Embodiment 1, the exposed surfaces of the semiconductor substrates of the semiconductor laser array 30 and the semiconductor modulator array 40 are vertically reversed to each other with respect to the base 9, whereby the degree of freedom is generated in the vertical direction when the semiconductor laser chip 61 and the semiconductor waveguide chip 62 are mounted, so that the semiconductor laser chip 61 and the semiconductor waveguide chip 62 can be easily mounted. The following is a detailed explanation.

A method of mounting the semiconductor laser chip 61 and the semiconductor waveguide chip 62 will be described. First, the semiconductor laser chip 61 mounted on the submount substrate 10 is die-bonded to the base 9 with the solder 8. Next, the semiconductor waveguide chip 62 mounted on the submount substrate 11 is aligned such that the waveguide 12 of the semiconductor laser array 30 and the waveguide 13 of the semiconductor modulator array 40 are aligned to be butted against each other, and then fixed to the base 9 with the resin 28. Since the thickness (layer thickness) from the first insulating layer 22 to the second insulating layer 24 of the semiconductor modulator array 40 is small with respect to the layer thickness of the n-InP substrate 1 of the semiconductor laser array 30, there is a sufficient gap between the submount substrate 11 of the semiconductor modulator array 40 and the base 9 to adjust their relative position. Therefore, the optical transmission device 60 of Embodiment 1 has a large degree of freedom in the vertical direction in the alignment of the semiconductor waveguide chip 62, making it easy to align the semiconductor waveguide chip 62. Further, in the optical transmission device 60 of Embodiment 1, since the semiconductor laser array 30 is mounted on the base 9 via the submount substrate 10 in the junction-up configuration, in other words, the InGaAsP active layer 3 is located farther from the base 9 than the n-InP substrate 1, high reliability of the semiconductor laser array 30 can be achieved. High reliability is required for optical transmission devices for optical communication. Since the semiconductor laser array 30 has high reliability, the optical transmission device 60 of Embodiment 1 satisfies the requirement of an optical transmission device for optical communication.

In the optical transmission device 60 of Embodiment 1, as shown in FIG. 4, the semiconductor modulator array 40 is flip-chip mounted without using the metal wire 17. Since the optical transmission device 60 of Embodiment 1 does not use the metal wire 17, excellent high-frequency response characteristics of the semiconductor modulator array 40 can be achieved. In particular, when the number of semiconductor modulators 41 is large as in Embodiment 1, the effect of not using the metal wire 17, that is, the effect of having excellent high-frequency response characteristics, will be more remarkable.

As a comparative example, an example is considered in which the semiconductor modulator array 40 is connected to the submount substrate 11 using the metal wire 17 (comparative example 1). When the metal wire 17 is used, an electric wiring up to the submount substrate 11 being an external electric circuit substrate to which the optical transmission device 60 is mounted will be done to its external electric circuit using a long metal wire 17 that crosses over a plurality of the semiconductor modulators 41. Alternatively, the cathode electrode 26 and/or the anode electrode 27 of the semiconductor modulator array 40 will be formed on the waveguide 13 of the semiconductor modulator 41 to be across the waveguide 13. The long metal wire 17 leads to degradation of high-frequency response characteristics, and a measure needs to be taken for the electrode (cathode electrode, anode electrode) that crosses the waveguide 13 to suppress optical reflection. Unlike the comparative example 1, in the optical transmission device 60 of Embodiment 1, since the semiconductor modulator array 40 is mounted on the submount substrate 11 by flip-chip mounting without using the metal wire 17, no measure for suppressing the light reflection is required, and high frequency response characteristics are excellent.

In the optical transmission device 60 of Embodiment 1, the semiconductor modulator array 40 is mounted so as to protrude more toward the side to the semiconductor laser array 30 than the substrate end face 18 of the submount substrate 11 at the end face (modulator end face 42) on the side where the semiconductor modulator array is butt-joined to the semiconductor laser array 30. In the case of achieving optical coupling by butt-joining between the waveguide 12 of the semiconductor laser array 30 and the waveguide 13 of the semiconductor modulator array 40, the gap between the waveguide 12 and the waveguide 13 needs to be made as narrow as possible in order to reduce the optical coupling loss. Here, a comparative example 2 is considered in which the modulator end face 42 of the semiconductor modulator array 40 is further from the semiconductor laser array 30 than the substrate end face 18 of the submount substrate 11. In the case of the comparative example 2, after the semiconductor modulator array 40 and the semiconductor laser array 30 are butt-joined, a large gap is formed between the waveguides of the semiconductor laser array 30 and the semiconductor modulator array 40, resulting in a large optical coupling loss. The modulator end face 42 of the semiconductor modulator array 40 is made to protrude more toward the side to the semiconductor laser array 30 than the substrate end face 18 of the submount substrate 11, or the modulator end face 42 of the semiconductor modulator array 40 is made flush with the substrate end face 18 of the submount substrate 11. That is, the problem above can be solved, for example, by making the plane including the modulator end face 42 coincide with the plane including the substrate end face 18, with respect to the laser end face 32 of the semiconductor laser array 30. Note that, as shown in FIG. 3, a substrate end face 19 of the submount substrate 10 on which the semiconductor laser chip 61 is mounted is flush with the laser end face 32 of the semiconductor laser chip 61.

The example in FIG. 1 and FIG. 3 shows that the modulator end face 42 of the semiconductor modulator array 40 is made to protrude more toward the side to the semiconductor laser array 30 than the substrate end face 18 of the submount substrate 11. In the optical transmission device 60 of Embodiment 1 shown in FIG. 1 and FIG. 3, since the modulator end face 42 of the semiconductor modulator array 40 is made to protrude more toward the side to the semiconductor laser array 30 than the substrate end face 18 of the submount substrate 11, the optical coupling loss between the semiconductor laser array 30 and the semiconductor modulator array 40 can be reduced as compared with the comparative example 2, so that the transmission distance of emitted light output as an optical signal can be extended.

Since positional variations occur when the semiconductor waveguide chip 62 in which the semiconductor modulator array 40 is formed is mounted on the submount substrate 11 using the solder bump 29, the design is made such that the modulator end face 42 of the semiconductor modulator array 40 protrudes toward the semiconductor laser array 30 than the substrate end face 18 of the submount substrate 11 from the beginning, and thereby, even if there is a chip misalignment, the modulator end face 42 of the semiconductor modulator array 40 is prevented from being farther from the semiconductor laser array 30 than the substrate end face 18. Thus, the required accuracy of the mounting position of the semiconductor waveguide chip 62 with respect to the submount substrate 11 can be relaxed.

As shown in FIG. 5, in the optical transmission device 60 of Embodiment 1, spot size conversion parts 33 and 43 on the end face sides in which the semiconductor laser array 30 and the semiconductor modulator array 40 are butt-joined are each provided for converting each of the spot sizes. Thus, in the optical transmission device 60 of Embodiment 1, the spot size of the emitted light on the output end face (laser end face 32) in the semiconductor laser array 30 is increased, and the spot size of the optical mode in the incident side waveguide 14 of the semiconductor modulator array 40 is also increased. As a result, an advantageous effect of suppressing the degradation of the optical coupling efficiency is obtained even in the case in which the positional variations occurs when the semiconductor modulator array 40 is mounted on the base 9. In other words, in the optical transmission device 60 of Embodiment 1, the required accuracy of the mounting position of the semiconductor modulator array 40 to obtain an optical coupling efficiency of a certain value (allowable lower limit) or more in the butt-joining of the waveguides can be relaxed.

Note that, FIG. 5 shows an example in which both the semiconductor laser array 30 and the semiconductor modulator array 40 facing each other have spot size conversion parts 33 and 43 for changing the spot sizes of the laser light generated by the semiconductor laser array 30 on the end face sides of the waveguides 12 and 13 facing each other. Further, either one of the semiconductor laser array 30 and the semiconductor modulator array 40 facing each other may have a spot size converting part for changing the spot size of the laser beam generated by the semiconductor laser array 30. In other words, in the optical transmission device 60 of Embodiment 1, the semiconductor laser array 30, namely, one of the semiconductor laser array 30 and the semiconductor modulator array 40 facing each other, may have the spot size converting section 33 for changing the spot size of the laser light generated by the semiconductor laser array 30 on the end face side of the waveguide 12. Further, in the optical transmission device 60 of Embodiment 1, the semiconductor modulator array 40, namely, the other of the semiconductor laser array 30 and the semiconductor modulator array 40 facing each other, may have the spot size converting part 43 for changing the spot size of the laser light generated by the semiconductor laser array 30 on the end face side of the waveguide 13.

Note that, the optical transmission device 60 may be an optical transmission device in which the modulator end face 42 of the semiconductor modulator array 40 is flush with the substrate end face 18 of the submount substrate 11. That is, the optical transmission device 60 may be the optical transmission device (first example) in which the plane including the modulator end face 42 coincides with the plane including the substrate end face 18 with respect to the laser end face 32 of the semiconductor laser array 30.

Figure 6:
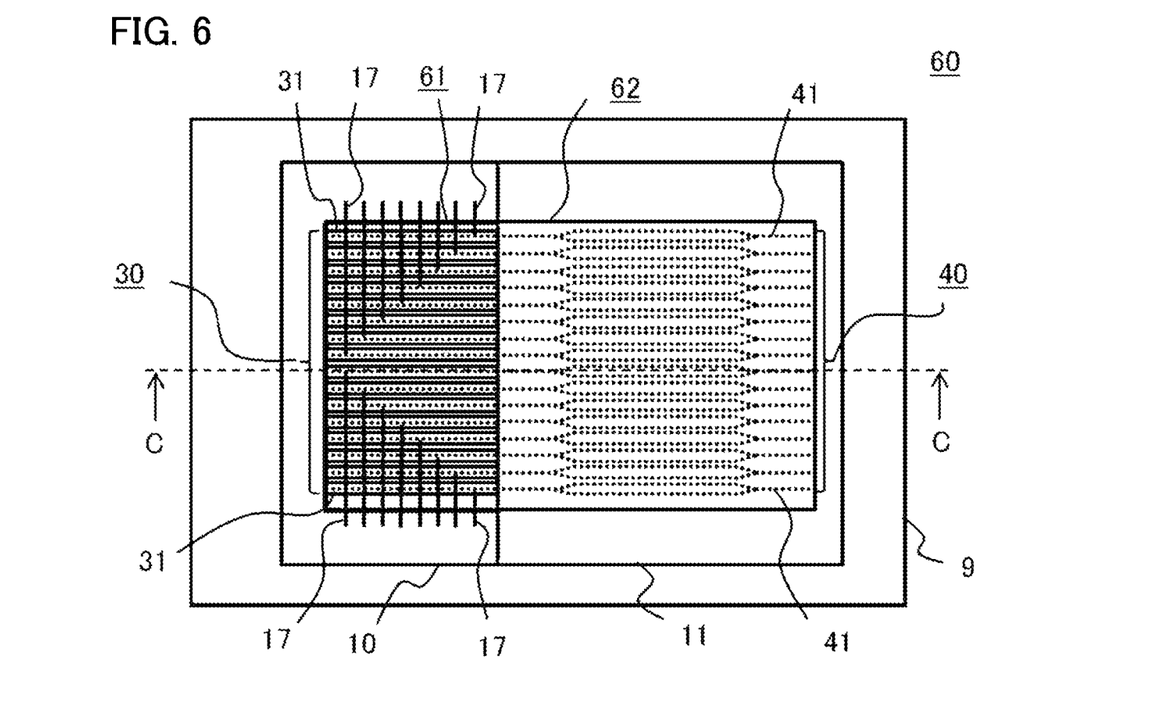
FIG. 6 is a plan view showing another optical transmission device according to Embodiment 1.
Figure 7:
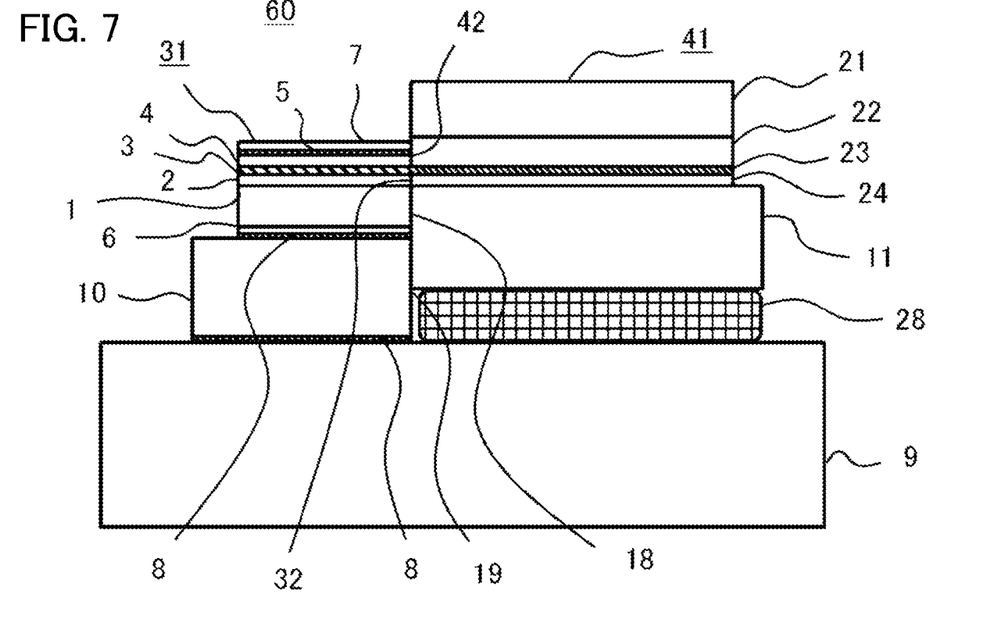
FIG. 7 is a cross-sectional view of the another optical transmission device of FIG. 6.

FIG. 6 is a plan view showing another optical transmission device according to Embodiment 1, and FIG. 7 is a cross-sectional view of the another optical transmission device of FIG. 6. FIG. 7 shows a cross section taken along the line C-C in FIG. 6. The another optical transmission device 60 of Embodiment 1 shown in FIGS. 6 and 7 differs from the optical transmission device 60 shown in FIGS. 1 and 3 in that the modulator end face 42 of the semiconductor modulator array 40 is flush with the substrate end face 18 of the submount substrate 11. The another optical transmission device 60 of Embodiment 1 shown in FIGS. 6 and 7 is the first example described above. In the first example of the another optical transmission device 60 of Embodiment 1 shown in FIGS. 6 and 7, the required accuracy of the mounting position of the semiconductor waveguide chip 62 with respect to the submount substrate 11 becomes more severe than that of the optical transmission device 60 shown in FIGS. 1 and 3. However, the first example of the another optical transmission device 60 of Embodiment 1 shown in FIGS. 6 and 7 has the same effect as that of the optical transmission device 60 shown in FIGS. 1 and 3, except for the effect of relaxing the required accuracy of the mounting position of the semiconductor waveguide chip 62 with respect to the submount substrate 11.

The optical transmission device 60 includes a case where the modulator end face 42 of the semiconductor modulator array 40 is closer to the laser end face 32 than the substrate end face 18 of the submount substrate 11, and a case where the modulator end face 42 of the semiconductor modulator array 40 is flush with the substrate end face 18 of the submount substrate 11. Therefore, in the optical transmission device 60, it can also be stated that the semiconductor waveguide chip 62 is disposed such that the modulator end face 42 including the end face of the modulator waveguide (waveguide 13) is not further than the substrate end face 18 that is the end face of the submount substrate 11 on the side to the semiconductor laser array 30 with respect to the laser end face 32 including the end face of the laser waveguide (waveguide 12).

The optical transmission device 60 of Embodiment 1 is an optical transmission device that includes the semiconductor laser array 30 having a plurality of the distributed feedback semiconductor lasers 31 formed on the first semiconductor substrate (n-InP substrate 1), and the semiconductor modulator array 40 formed on the second semiconductor substrate (silicon substrate 21) and having the same number of semiconductor modulators 41 as the semiconductor lasers 31. The optical transmission device 60 includes the semiconductor laser chip 61 in which the semiconductor laser array 30 is formed, and the semiconductor waveguide chip 62 in which the semiconductor modulator array 40 is formed. In the optical transmission device 60 of Embodiment 1, the laser wave guide (waveguide 12) and the modulator waveguide (waveguide 13) are butt-joined such that the distance between the end face of the laser waveguide being the waveguide 12 on the side to the semiconductor modulator array in each of the semiconductor lasers 31 of the semiconductor laser array 30 and the end face of the modulator waveguide being the waveguide 13 on the side to the semiconductor laser array in each of the semiconductor modulators 41 of the semiconductor modulator array 40 is 10 µm or less. In the optical transmission device 60 of Embodiment 1, with the configuration described above, the laser waveguide (waveguide 12) and the modulator waveguide (waveguide 13) are butt-joined such that the distance between the end face of the laser waveguide (waveguide 12) of the semiconductor laser array 30 and the modulator waveguide (waveguide 13) of the semiconductor modulator array 40 facing each other is 10 µm or less, and thus the structure is simple and high laser efficiency can be obtained.

Embodiment 2

Figure 8:
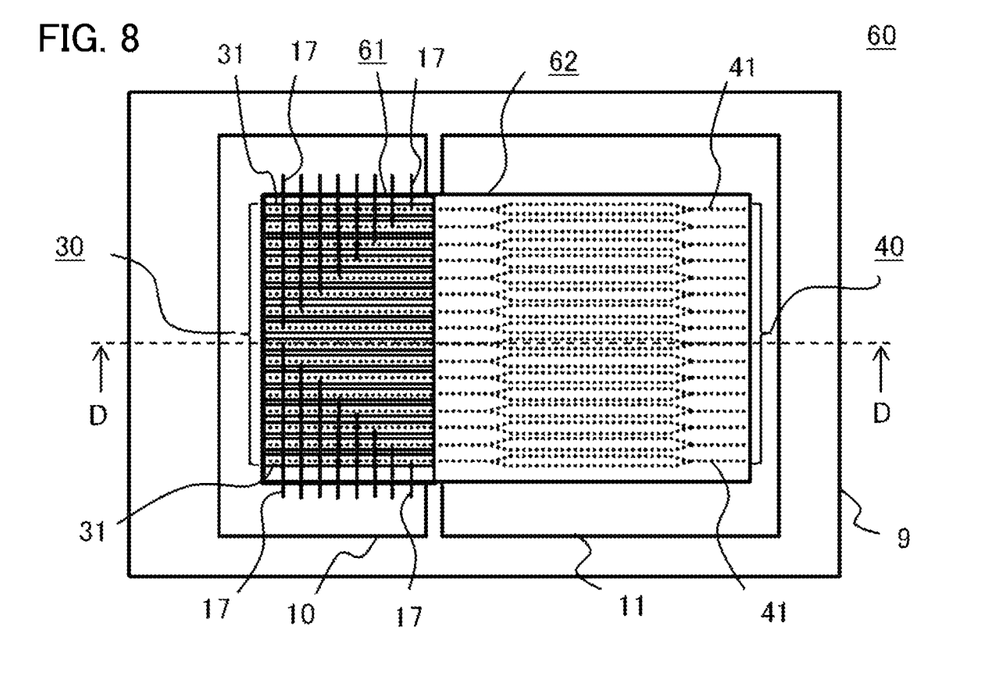
FIG. 8 is a plan view showing an optical transmission device according to Embodiment 2.
Figure 9:
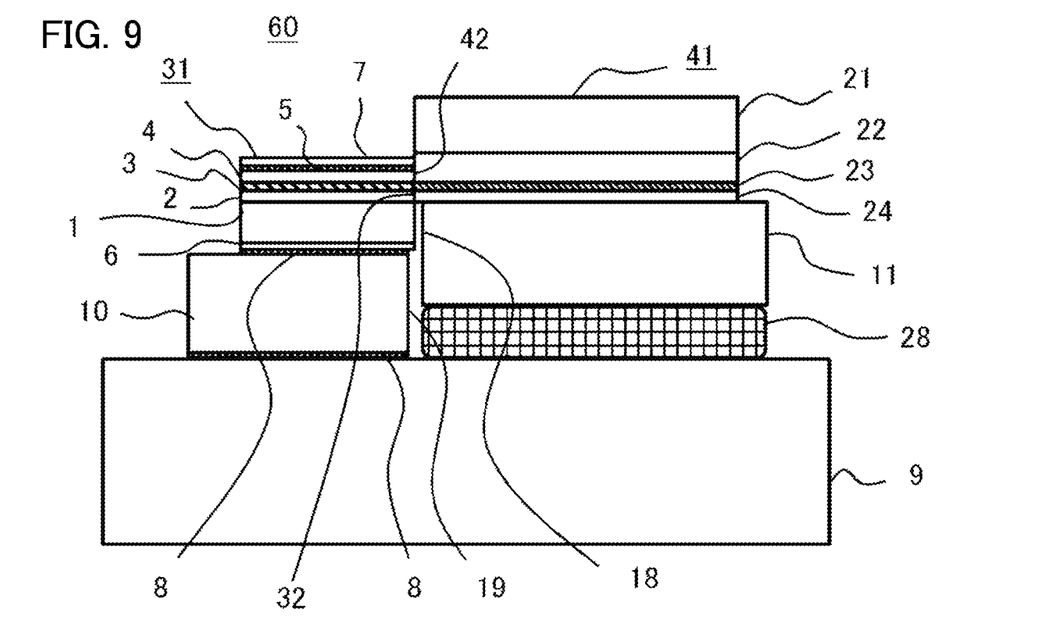
FIG. 9 is a cross-sectional view of the optical transmission device of FIG. 8.

FIG. 8 is a plan view showing an optical transmission device according to Embodiment 2, and FIG. 9 is a cross-sectional view of the optical transmission device of FIG. 8. FIG. 9 shows cross section taken along the line D-D in FIG. 8. The optical transmission device 60 of Embodiment 2 differs from the optical transmission device 60 of Embodiment 1 shown in FIGS. 1 and 3 in that the semiconductor laser array 30 is mounted on the submount substrate 10 to protrude from the substrate end face 19 of the submount substrate 10 to the side to the semiconductor modulator array 40 (different structure) at the end face (laser end face 32) on the side where the semiconductor laser array 30 is to be butt-joined to the semiconductor modulator array 40. Other structures of the optical transmission device 60 of Embodiment 2 except for the different structure are the same as those of the optical transmission device 60 of Embodiment 1 shown in FIGS. 1 to 5. Since the laser end face 32 protrudes toward the semiconductor modulator array 40 from the substrate end face 19 of the submount substrate 10 and the modulator end face 42 protrudes toward the semiconductor laser array 30 from the substrate end face 18 of the submount substrate 11, in the optical transmission device 60 of Embodiment 2, the gap between the waveguide 12 and the waveguide 13 can be narrowed, and thereby the optical coupling loss can be reduced. In the optical transmission device 60 of Embodiment 2, similar to the optical transmission device 60 of Embodiment 1, the laser waveguide (waveguide 12) and the modulator waveguide (waveguide 13) are butt-joined such that the distance between the end face of the laser waveguide (waveguide 12) of the semiconductor laser array 30 and the end face of the modulator waveguide (waveguide 13) of the semiconductor modulator array 40 facing each other is 10 µm or less, and thus the structure is simple and high laser efficiency can be obtained.

Embodiment 3

Figure 10:
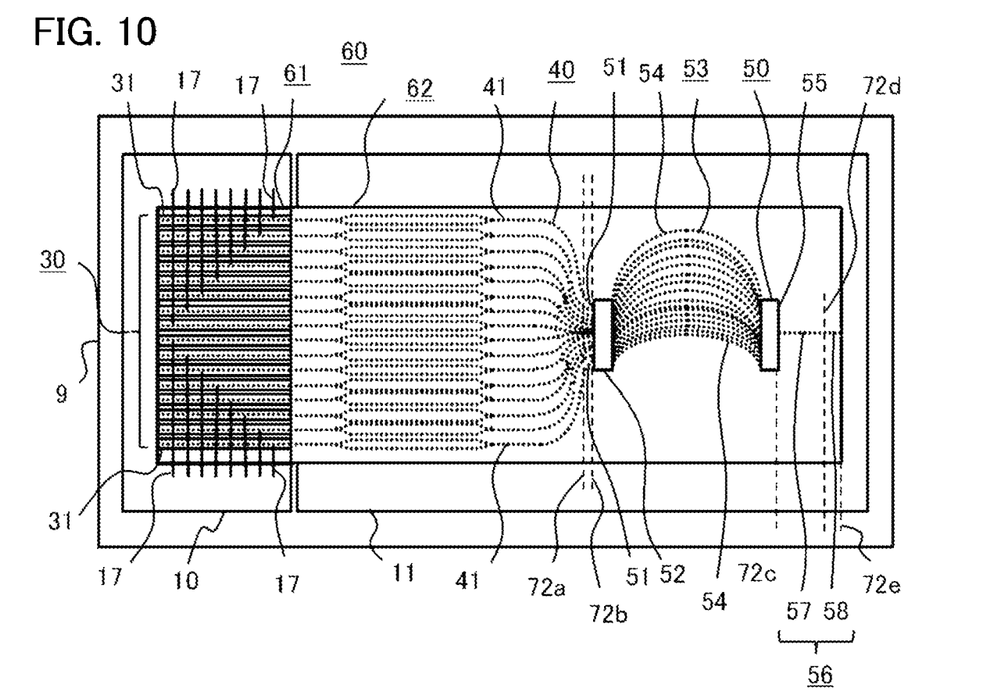
FIG. 10 is a plan view showing an optical transmission device according to Embodiment 3.

FIG. 10 is a plan view showing an optical transmission device according to Embodiment 3. The optical transmission device 60 of Embodiment 3 differs from the optical transmission device 60 of Embodiments 1 and 2 in that the optical transmission device includes an optical multiplexer 50. FIG. 10 shows an example in which the optical transmission device 60 of Embodiment 1 shown in FIG. 1 is modified. The optical transmission device 60 of Embodiment 3 is an optical transmission device in which the semiconductor laser chip 61 having the semiconductor laser array 30 formed therein and the semiconductor waveguide chip 62 having the semiconductor modulator array 40 and an optical multiplexer 50 formed therein are hybrid integrated, namely, a hybrid integrated transmission device. The semiconductor modulator array 40 and the optical multiplexer 50 are monolithically integrated on the silicon substrate 21. The semiconductor waveguide chip 62 has the optical multiplexer 50 that multiplexes a plurality of emitted light beams output from the semiconductor modulators 41 of the semiconductor modulator array 40 into one emitted light beam. The structure of the semiconductor laser array 30 and the structure of the semiconductor modulator array 40 except for the shape of the emission side waveguide 16 of the semiconductor modulator array 40 are the same as those in Embodiment 1. The parts different from the optical transmission device 60 of Embodiment 1 will be mainly described.

The semiconductor laser array 30 includes sixteen distributed feedback semiconductor lasers 31, and the semiconductor modulator array 40 includes the sixteen semiconductor modulators 41 that are sixteen Mach-Zehnder modulators. The optical multiplexer 50 is an arrayed waveguide grating (AWG). In FIG. 10, a portion from the broken line 72a to the left on the semiconductor waveguide chip 62 is the semiconductor modulator array 40, and a portion from the broken line 72a to the right on the semiconductor waveguide chip 62 is the optical multiplexer 50. The emission side waveguides 16 on an emission side in the sixteen waveguides 13 of the semiconductor modulator array 40 are connected to the optical multiplexer 50. The optical multiplexer 50 includes sixteen incident side waveguides 51, an incident slab waveguide 52, an array waveguide part 53 having sixteen waveguides 54, an emission slab waveguide 55, and one emission side waveguide 56.

A spot size conversion part 58 is formed near the emission end face in the emission side waveguide 56 of the optical multiplexer 50. The emission side waveguide 56 includes a transmission part 57 in a region away from the emission end face and a spot size conversion part 58 on the emission end face side. The transmission part 57 is from the broken line 72c to the broken line 72d in FIG. 10, and the spot size conversion part 58 is from the broken line 72d to the broken line 72e. The emission end face of the optical multiplexer 50 is the right end face of the semiconductor waveguide chip 62 in FIG. 10. In the waveguide structure of the incident side waveguides 51, the waveguides 54, and the emission side waveguide 56 in the optical multiplexer 50, the first insulating layer 22 of $SiO_2$, the silicon layer 23, and the second insulating layer 24 of $SiO_2$ are sequentially formed on the surface (surface on the side facing the submount substrate 11) of the silicon substrate 21 (refer to FIG. 4). The silicon layer 23 is in the mesa stripe shape, and the mesa stripe of the silicon layer 23 serves as a core of the waveguide.

In the optical transmission device 60 of Embodiment 3, sixteen emitted light beams having different wavelengths generated by the semiconductor laser array 30 are each modulated by the semiconductor modulator array 40 and multiplexed into one emitted light beam by the optical multiplexer 50. In the optical transmission device 60 of Embodiment 3, by monolithically integrating on the silicon substrate 21, the semiconductor modulator array 40 and the optical multiplexer 50 being an arrayed waveguide diffraction grating, the optical transmission device can be made smaller and easier to be mounted, as compared with the case of using a spatial optical multiplexer or the case of optically coupling the modulator array and the optical multiplexer with lenses. Since the optical transmission device 60 of Embodiment 3 has a similar configuration as that of the optical transmission device 60 of Embodiment 1, the same advantages as those of the optical transmission device 60 of Embodiment 1 are obtained. Although FIG. 10 shows an example in which the optical transmission device 60 of Embodiment 1 shown in FIG. 1 is modified, the configuration of the optical transmission device 60 of Embodiment 3 can also be applied to the other optical transmission device 60 of Embodiment 1 shown in FIG. 6 and the optical transmission device 60 of Embodiment 2.

Note that, although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: n-InP substrate (first semiconductor substrate), 3: InGaAsP active layer, 9: base, 10: submount substrate (submount substrate for laser), 11: submount substrate, 12: waveguide (laser waveguide), 13: waveguide (modulator waveguide), 18: substrate end face, 19: substrate end face, 20: metal wiring, 21: silicon substrate (second semiconductor substrate), 26: cathode electrode, 27: anode electrode, 29: solder bump (connecting material), 30: semiconductor laser array, 31: semiconductor laser, 32: laser end face, 33 spot size conversion part, 40: semiconductor modulator array, 41: semiconductor modulator, 42: modulator end face, 43: spot size conversion part, 50: optical multiplexer, 60: optical transmission device, 61: semiconductor laser chip, 62: semiconductor waveguide chip

The invention claimed is:

1. An optical transmission device comprising:
a semiconductor laser array having a plurality of distributed feedback semiconductor lasers formed on a first semiconductor substrate;
a semiconductor modulator array formed on a second semiconductor substrate and having the same number of semiconductor modulators as the semiconductor lasers;
a semiconductor laser chip in which the semiconductor laser array is formed; and
a semiconductor waveguide chip in which the semiconductor modulator array is formed,
wherein a laser wave guide and a modulator waveguide are butt-joined such that a distance between an end face of the laser waveguide being a waveguide on a side to the semiconductor modulator array in each of the semiconductor lasers of the semiconductor laser array and an end face of the modulator waveguide being a waveguide on a side to the semiconductor laser array in each of the semiconductor modulators of the semiconductor modulator array is 10 µm or less;
the semiconductor laser chip and the semiconductor waveguide chip are mounted on a base;
the semiconductor laser array is disposed such that the laser waveguide including an active layer of the semiconductor laser is farther than the first semiconductor substrate with respect to the base;
the semiconductor modulator array is disposed such that the modulator waveguide of the semiconductor modulator is closer to a side to the base than the second semiconductor substrate; and
a thickness from a surface of the semiconductor modulator array on a side to the base to a surface of the second semiconductor substrate on the side to the base is thinner than a thickness of the first semiconductor substrate.

2. The optical transmission device according to claim 1, wherein
a resin is interposed between the semiconductor waveguide chip and the base.

3. The optical transmission device according to claim 1, wherein
the semiconductor waveguide chip is mounted on a submount substrate; and
an anode electrode and a cathode electrode of the semiconductor modulator are formed on a side of the modulator waveguide that is closer to the side to the base than the second semiconductor substrate in the semiconductor modulator array,
the anode electrode and the cathode electrode being connected to metal wiring formed on the submount substrate with a connecting material different from a metal wire.

4. The optical transmission device according to claim 3, wherein
the connecting material is a solder bump.

5. The optical transmission device according to claim 3, wherein
the semiconductor waveguide chip is disposed such that a modulator end face including the end face of the modulator waveguide is closer to a laser end face including the end face of the laser waveguide than a substrate end face that is an end face on the side to the semiconductor laser array in the submount substrate.

6. The optical transmission device according to claim 3, wherein
the semiconductor waveguide chip is disposed such that a modulator end face including the end face of the modulator waveguide is not further from a laser end face including the end face of the laser waveguide than a substrate end face that is an end face on the side to the semiconductor laser array in the submount substrate.

7. The optical transmission device according to claim 1, wherein
the semiconductor laser chip is mounted on a laser submount substrate, and
the semiconductor laser chip is disposed such that the laser end face including the end face of the laser waveguide is closer to the modulator end face including the end face of the modulator waveguide than a substrate end face that is an end face on the side to the semiconductor modulator array in the laser submount substrate.

8. The optical transmission device according to claim 1, wherein
the semiconductor laser chip is mounted on a laser submount substrate, and
the semiconductor laser chip is disposed such that the laser end face including the end face of the laser waveguide is not further from the modulator end face including the end face of the modulator waveguide than a substrate end face that is an end face on the side to the semiconductor modulator array in the laser submount substrate.

9. The optical transmission device according to claim 1, wherein
either or both of the semiconductor laser array and the semiconductor modulator array facing each other include a spot size conversion part for changing a spot size of laser light generated by the semiconductor laser array on end face sides of the waveguides facing each other.

10. The optical transmission device according to claim 1, wherein
the semiconductor waveguide chip incudes an optical multiplexer that multiplexes a plurality of emitted light beams each output from each of the semiconductor modulators of the semiconductor modulator array into one emitted light beam.

11. The optical transmission device according to claim 10, wherein
the optical multiplexer is an arrayed waveguide diffraction grating.

12. The optical transmission device according to claim 1, wherein
each of the semiconductor modulators in the semiconductor modulator array is a Mach-Zehnder modulator.

13. The optical transmission device according to claim 2, wherein
the semiconductor waveguide chip is mounted on a submount substrate; and
an anode electrode and a cathode electrode of the semiconductor modulator are formed on a side of the modulator waveguide that is closer to the side to the base than the second semiconductor substrate in the semiconductor modulator array,
the anode electrode and the cathode electrode being connected to metal wiring formed on the submount substrate with a connecting material different from a metal wire.

14. The optical transmission device according to claim 4, wherein
the semiconductor waveguide chip is disposed such that a modulator end face including the end face of the modulator waveguide is closer to a laser end face including the end face of the laser waveguide than a substrate end face that is an end face on the side to the semiconductor laser array in the submount substrate.

15. The optical transmission device according to claim 4, wherein
the semiconductor waveguide chip is disposed such that a modulator end face including the end face of the modulator waveguide is not further from a laser end face including the end face of the laser waveguide than a substrate end face that is an end face on the side to the semiconductor laser array in the submount substrate.

16. The optical transmission device according to claim 2, wherein
the semiconductor laser chip is mounted on a laser submount substrate, and
the semiconductor laser chip is disposed such that the laser end face including the end face of the laser waveguide is closer to the modulator end face including the end face of the modulator waveguide than a substrate end face that is an end face on the side to the semiconductor modulator array in the laser submount substrate.

17. The optical transmission device according to claim 3, wherein
the semiconductor laser chip is mounted on a laser submount substrate, and
the semiconductor laser chip is disposed such that the laser end face including the end face of the laser waveguide is closer to the modulator end face including the end face of the modulator waveguide than a substrate end face that is an end face on the side to the semiconductor modulator array in the laser submount substrate.

18. The optical transmission device according to claim 2, wherein
the semiconductor laser chip is mounted on a laser submount substrate, and
the semiconductor laser chip is disposed such that the laser end face including the end face of the laser waveguide is not further from the modulator end face including the end face of the modulator waveguide than a substrate end face that is an end face on the side to the semiconductor modulator array in the laser submount substrate.

19. The optical transmission device according to claim 3, wherein
the semiconductor laser chip is mounted on a laser submount substrate, and
the semiconductor laser chip is disposed such that the laser end face including the end face of the laser waveguide is not further from the modulator end face including the end face of the modulator waveguide than a substrate end face that is an end face on the side to the semiconductor modulator array in the laser submount substrate.

20. The optical transmission device according to claim 2, wherein
either or both of the semiconductor laser array and the semiconductor modulator array facing each other include a spot size conversion part for changing a spot size of laser light generated by the semiconductor laser array on end face sides of the waveguides facing each other.

21. The optical transmission device according to claim 1, wherein
the semiconductor laser array and the first semiconductor substrate are a monolithic semiconductor structure.

22. The optical transmission device according to claim 1, wherein
the semiconductor modulator array and the second semiconductor substrate are a monolithic semiconductor structure.

* * * * *